(12) United States Patent
Malinowski et al.

(10) Patent No.: US 11,646,361 B2
(45) Date of Patent: May 9, 2023

(54) ELECTRICAL ISOLATION STRUCTURE USING REVERSE DOPANT IMPLANTATION FROM SOURCE/DRAIN REGION IN SEMICONDUCTOR FIN

(71) Applicant: GLOBALFOUNDRIES U.S. Inc., Santa Clara, CA (US)

(72) Inventors: Arkadiusz Malinowski, Dresden (DE); Alexander M. Derrickson, Saratoga Springs, NY (US); Haiting Wang, Clifton Park, NY (US)

(73) Assignee: GlobalFoundries U.S. Inc., Santa Clara, CA (US)

(*) Notice: Subject to any disclaimer, the term of this patent is extended or adjusted under 35 U.S.C. 154(b) by 141 days.

(21) Appl. No.: 17/191,886

(22) Filed: Mar. 4, 2021

(65) Prior Publication Data
US 2022/0285523 A1 Sep. 8, 2022

(51) Int. Cl.
H01L 29/66 (2006.01)
H01L 29/06 (2006.01)
H01L 21/8234 (2006.01)
H01L 29/78 (2006.01)

(52) U.S. Cl.
CPC .. *H01L 29/6681* (2013.01); *H01L 21/823412* (2013.01); *H01L 21/823418* (2013.01); *H01L 21/823431* (2013.01); *H01L 29/0653* (2013.01); *H01L 29/7851* (2013.01)

(58) Field of Classification Search
CPC ............. H01L 29/6681; H01L 29/0653; H01L 29/7851; H01L 21/823412; H01L 21/823418; H01L 21/823431
See application file for complete search history.

(56) References Cited

U.S. PATENT DOCUMENTS

| | | |
|---|---|---|
| 3,029,366 A | 4/1962 | Lehovec |
| 3,958,040 A | 5/1976 | Webb |
| 4,026,736 A | 5/1977 | Lesk |
| 9,570,442 B1 | 2/2017 | Liu et al. |
| 9,997,617 B2 | 6/2018 | Yang et al. |
| 10,177,151 B1 | 1/2019 | Wang et al. |
| 2016/0336183 A1 | 11/2016 | Yuan et al. |
| 2018/0033699 A1* | 2/2018 | Zhu ................... H01L 21/76232 |
| 2020/0052117 A1* | 2/2020 | Mehandru ........... H01L 27/0886 |
| 2020/0365711 A1* | 11/2020 | Glass ............... H01L 21/823821 |
| 2021/0193656 A1* | 6/2021 | Ahn .................. H01L 21/76232 |

* cited by examiner

*Primary Examiner* — Christine A Enad
(74) *Attorney, Agent, or Firm* — Francois Pagette; Hoffman Warnick LLC

(57) ABSTRACT

A structure includes a semiconductor fin on a substrate. A first fin transistor (finFET) is on the substrate, and a second finFET is on the substrate adjacent the first finFET. The first finFET and the second finFET include respective pairs of source/drain regions with each including a first dopant of a first polarity. An electrical isolation structure is in the semiconductor fin between one of the source/drain regions of the first finFET and one of the source/drain regions for the second FinFET, the electrical isolation structure including a second dopant of an opposing, second polarity. The electrical isolation structure extends to an upper surface of the semiconductor fin. A related method is also disclosed.

15 Claims, 11 Drawing Sheets

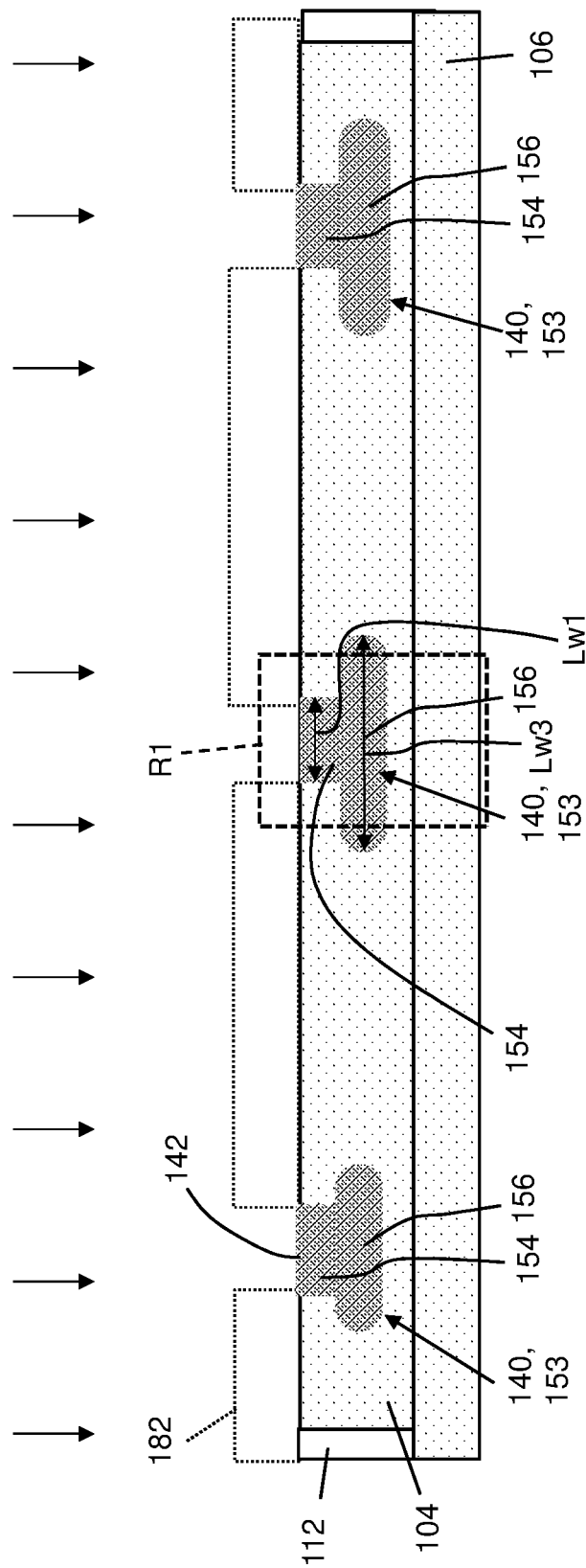

ELECTRICAL ISOLATION STRUCTURE USING REVERSE DOPANT IMPLANTATION FROM SOURCE/DRAIN REGION IN SEMICONDUCTOR FIN

BACKGROUND

The present disclosure relates to integrated circuits, and more specifically, to an electrical isolation structure including a region between adjacent source/drain regions of two fin transistors (finFETs) having a different polarity dopant therein than the source/drain regions.

Diffusion breaks are employed to cut a semiconductor fin and to isolate finFETs formed using the semiconductor fin. The diffusion breaks include a dielectric portion formed into the fin between adjacent finFETs. Diffusion breaks present a number of challenges including high levels of structural variability and large current leakage. Most notably, diffusion breaks may lead to device performance degradation.

SUMMARY

An aspect of the disclosure is directed to a structure, comprising: a semiconductor fin on a substrate; a first fin transistor (finFET) on the substrate, the first finFET including a first pair of source/drain regions separated by a first channel; a second finFET on the substrate adjacent the first finFET, the second finFET including a second pair of source/drain regions separated by a second channel, the first and the second pairs of source/drain regions each including a first dopant of a first polarity; and an electrical isolation structure in the semiconductor fin between one of the first pair of source/drain regions of the first finFET and one of the second pair of source/drain regions of the second FinFET, the electrical isolation structure including a second dopant of an opposing, second polarity, wherein the electrical isolation structure extends to an upper surface of the semiconductor fin.

Another aspect of the disclosure includes an electrical isolation structure for adjacent fin transistors (finFETs), the adjacent finFETs including a first pair of source/drain regions separated by a first channel and a second pair of source/drain regions separated by a second channel, the first and second pair of source/drain regions each including a first dopant of a first polarity in a semiconductor fin on a substrate, the electrical isolation structure comprising: a body in the semiconductor fin between one of the first pair of source/drain regions and one of the second pair of source/drain regions, the body including a second dopant of an opposing, second polarity, wherein the body extends to an upper surface of the semiconductor fin.

An aspect of the disclosure related to a method, comprising: forming a first pair of source/drain regions for a first fin transistor (finFET) and a second pair of source/drain regions for a second finFET in a semiconductor fin adjacent a region of the semiconductor fin, the first and second pairs of source/drain regions including a first dopant of a first polarity; doping the semiconductor fin in the region between one of the first pair of source/drain regions and one of the second pair of source/drain regions with a second dopant of an opposing, second polarity, forming an electrical isolation structure in the semiconductor fin, wherein the electrical isolation structure extends to an upper surface of the semiconductor fin; and forming an active gate for the first finFET over a first channel between the first pair of source/drain regions and an active gate for the second finFET over a second channel between the second pair of source/drain regions.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 11 shows a cross-sectional view of forming an electrical isolation structure prior to any gate formation, according to alternative embodiments of the disclosure.

Figure 1:
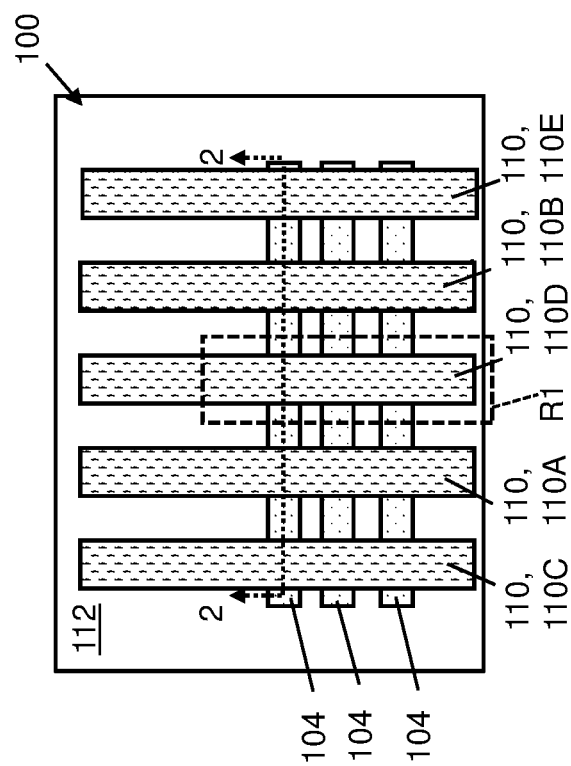
FIG. 1 shows a plan view of an initial structure to be processed according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a structure including a semiconductor fin on a substrate. A first fin transistor (finFET) is on the substrate, and a second finFET is on the substrate adjacent to the first finFET. The first finFET includes a first pair of source/drain regions and the second finFET includes a second pair of source/drain regions with each including a first dopant of a first polarity, i.e., the finFETs are of the same polarity. An electrical isolation structure is in the semiconductor fin between one of the first pair of source/drain regions of the first finFET and one of the second pair of source/drain regions of the second finFET, the electrical isolation structure including a second dopant of an opposing, second polarity. The electrical isolation structure thus forms a PNP or NPN junction with the adjacent source/drain regions, creating an electrical isolation. The electrical isolation structure extends to an upper surface of the semiconductor fin. A related method and electrical isolation structure are also disclosed. The electrical isolation structure provides an effective electrical isolation within a semiconductor fin without the use of dielectrics, such as oxide, between devices. The implementation using doping avoids the structural variability of forming fin cut/openings for diffusion breaks, such as sloped surfaces on upper surfaces of the openings that can lead to current leakage and other performance issues. Where certain stresses are imparted to the fin to improve device performance, the electrical isolation structure avoids stress changes caused by the fin cut/openings and any related loss of device performance. Since the fin cut/openings do not need to be formed, the implementation also has reduced cycle time.

Figure 2:
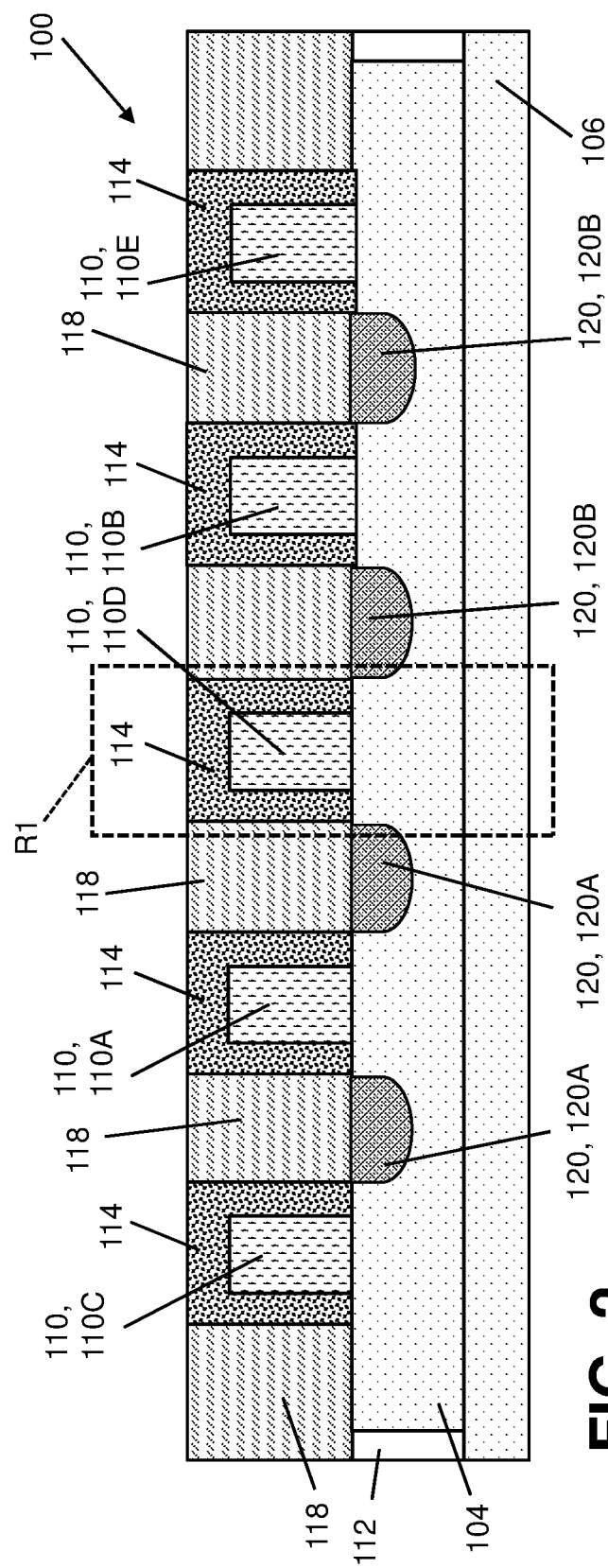
FIG. 2 shows a lateral cross-sectional view of the structure along line 2-2 of FIG. 1 according to embodiments of the disclosure.

FIG. 1 shows a plan view and FIG. 2 shows a cross-sectional view along view line 2-2 in FIG. 1 of a structure 100 to be processed according to the present disclosure. The example structure 100 of FIG. 1 illustrates one preliminary set of materials targeted for use with embodiments of the disclosure, but it is understood that embodiments of the disclosure can be implemented on different designs without any change to the techniques discussed herein. Structure 100 can include a semiconductor fin 104 on a substrate 106. For purposes of description, the drawings show a set (i.e., one or more) of semiconductor fins 104 (hereinafter "fin," "fin(s)" or "fins") on substrate 106 extending in a first direction, with three fins 104 being provided for the sake of example. Structure 100 may also include a set (i.e., one or more) dummy gates 110 extending transversely over fins 104, with each dummy gate 110 having one or more regions positioned over corresponding fin(s) 104 in structure 100. Five dummy gates 110 are shown for the purposes of description. A shallow trench isolation 112 (shown without cross-hatching in FIG. 1 solely for clarity) of structure 100, may be positioned underneath and/or adjacent to fin(s) 104 and dummy gate(s) 110.

Dummy gates 110 are employed as part of a replacement metal gate (RMG) process. The RMG process may include any now known or later developed RMG techniques. The RMG process may include, for example, using dummy gate(s) 110 as placeholders for later formed metal gates. Dummy gates 110 allow processing source/drain dopant anneal (high temperature process) without shifting the transistor's threshold voltage ($V_{th}$). The dummy gates 110 are eventually replaced with metal gates to form active gates for finFETs, or inactive gates.

A design rule for a product may include a region R1 of fin(s) 104 that must be removed for replacement with a dielectric to form an electrical isolation to electrically separate two portions of the same fin. The electrical isolation is commonly referred to as a diffusion break. Forming a diffusion break in region R1 will isolate active regions, e.g., FETs, on opposite sides of the diffusion break from each other. Although a particular region R1 is shown in FIG. 1 for the purposes of example, it is understood that multiple regions may be processed according to the disclosure without modifying or otherwise departing from the various techniques discussed herein.

Referring to FIG. 2, the various components of structure 100 are discussed in further detail to better illustrate subsequent processing in embodiments of the disclosure. Region R1 is depicted in FIG. 2 for correspondence with FIG. 1. Each fin 104 can be formed from an underlying semiconductor substrate 106, e.g., by removing targeted portions of substrate 106 to a predetermined depth, causing the non-removed portions to form fins 104 directly on substrate 106. Fin(s) 104 and substrate 106 can include, e.g., one or more currently-known or later developed semiconductor substances generally used in semiconductor manufacturing, including but not limited to: silicon (e.g., crystal silicon) or silicon germanium. The application of stresses to field effect transistors (FETs) is known to improve their performance. Each fin 104 can have a stress applied thereto. For example, when applied in a longitudinal direction (i.e., in the direction of current flow), tensile stress is known to enhance electron mobility (or n-channel FET (NFET) drive currents), while compressive stress is known to enhance hole mobility (or p-channel FET (PFET) drive currents).

Structure 100 may include at least one shallow trench isolation (STI) 112 (FIG. 1 only) positioned on substrate 106, as well as between fins 104 and dummy gates 110. Each STI 112 may be formed of any currently-known or later developed substance for providing electrical insulation, and as examples may include: silicon nitride ($Si_3N_4$), silicon oxide ($SiO_2$), fluorinated $SiO_2$ (FSG), boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Each dummy gate 110 may take the form of a non-functional gate or placeholder structure. As noted, such components may be eventually replaced with functional elements, e.g., active metal gates, in other process steps. Dummy gates 110 may cover one or more semiconductor fins 104 positioned above substrate 106, e.g., by coating exposed sidewalls and an upper surface of fin(s) 104. Dummy gate(s) 110 may include, for example, polysilicon or amorphous silicon. Dummy gate(s) 110 may be formed by deposition and then patterning of the material. Dummy gate(s) 110 can also include corresponding dummy gate spacers 114. Gate spacer(s) 114 can be provided as one or more bodies of insulating material formed on exposed portions of STI(s) 112 and/or dummy gate(s) 110, e.g., by deposition, thermal growth, etc., and may include materials and/or other structures formed on or adjacent to dummy gate(s) 110 to electrically and physically insulate dummy gate(s) 110 from other components of structure 100. In an example embodiment, gate spacer(s) 114 can be provided as a region of silicon nitride (SiN) with or without other insulating materials being included therein. Spacer(s) 114 may be formed by deposition of spacer material, and then etching back the material.

The lateral space between gate spacer(s) 114 in structure 100 can be occupied by one or more inter-layer dielectric (ILD) regions 118, which may include the same insulating material as STI(s) 112 or may include a different electrically insulative material. STI(s) 112 and ILD region 118 nonetheless constitute different components, e.g., due to STI(s) 112 being formed before dummy gate(s) 110, and ILD region 118 being formed on fin(s) 104, dummy gate(s) 110, and STI(s) 112 together.

FIG. 2 shows forming source/drain regions 120. More particularly, FIG. 2 shows forming a first pair of source/drain regions 120A for a to-be-formed, first fin transistor (finFET) 130 (FIGS. 6 and 9) and a second pair of source/drain regions 120B for a to-be-formed, second finFET 132 (FIGS. 6 and 9) in semiconductor fin 104 adjacent region R1 of semiconductor fin 104. As illustrated, dummy gates 110A, 110B are positioned where finFETs 130, 132 will be located. As shown in FIG. 2, each fin 104 can include a pair of source/drain regions 120 positioned below ILD regions 118 and adjacent to dummy gates 110. Source/drain regions 120 may be formed within fin 104 prior to deposition of ILD regions 118. For example, source/drain regions 120 may be formed by forming openings within fin 104 and epitaxially growing another semiconductor material within the openings, thereby forming source/drain (epitaxial) regions 120 with a different material composition from the remainder of fin 104. Dummy gates 110 and their spacers 114 may shield a portion of the fin 104 when source/drain regions 120 are being formed. Source/drain regions 120 may initially include the same semiconductor material of fin 104, or a different semiconductor material before being implanted with dopants. Source/drain regions 120, after being implanted with dopants, may have a different composition from the remainder of fin 104. To form epitaxial source/drain regions 120, selected portions of fin 104 may be epitaxially grown on fins 104. The dopants used to form source/drain regions 120 may be doped in situ or an implantation process may be performed to affect only source/drain regions 120 of structure 100. According to an example, fins 104 are not previously doped before source/drain regions 120 are formed within structure 100. A dopant implantation process may be performed to dope fin(s) 104 and source/drain regions 120 together. As will be recognized, source/drain regions 120 are doped with a dopant having selected polarity for the desired finFET. An n-type finFET may include n-type dopants such as but not limited to: phosphorous (P), arsenic (As), antimony (Sb), and a p-type finFET may include p-type dopants such as but not limited to: boron (B), indium (In) and gallium (Ga). Any necessary thermal process may be carried out to drive in the dopants. According to embodiments of the disclosures, first and second pairs of source/drain regions 120A-B include a first dopant of a first polarity, i.e., either n-type or p-type. Hence, first pair of source/drain regions 120A and second pair of source/drain regions 120B include the same first dopant of a first polarity, i.e., either n-type or p-type.

Figure 4:
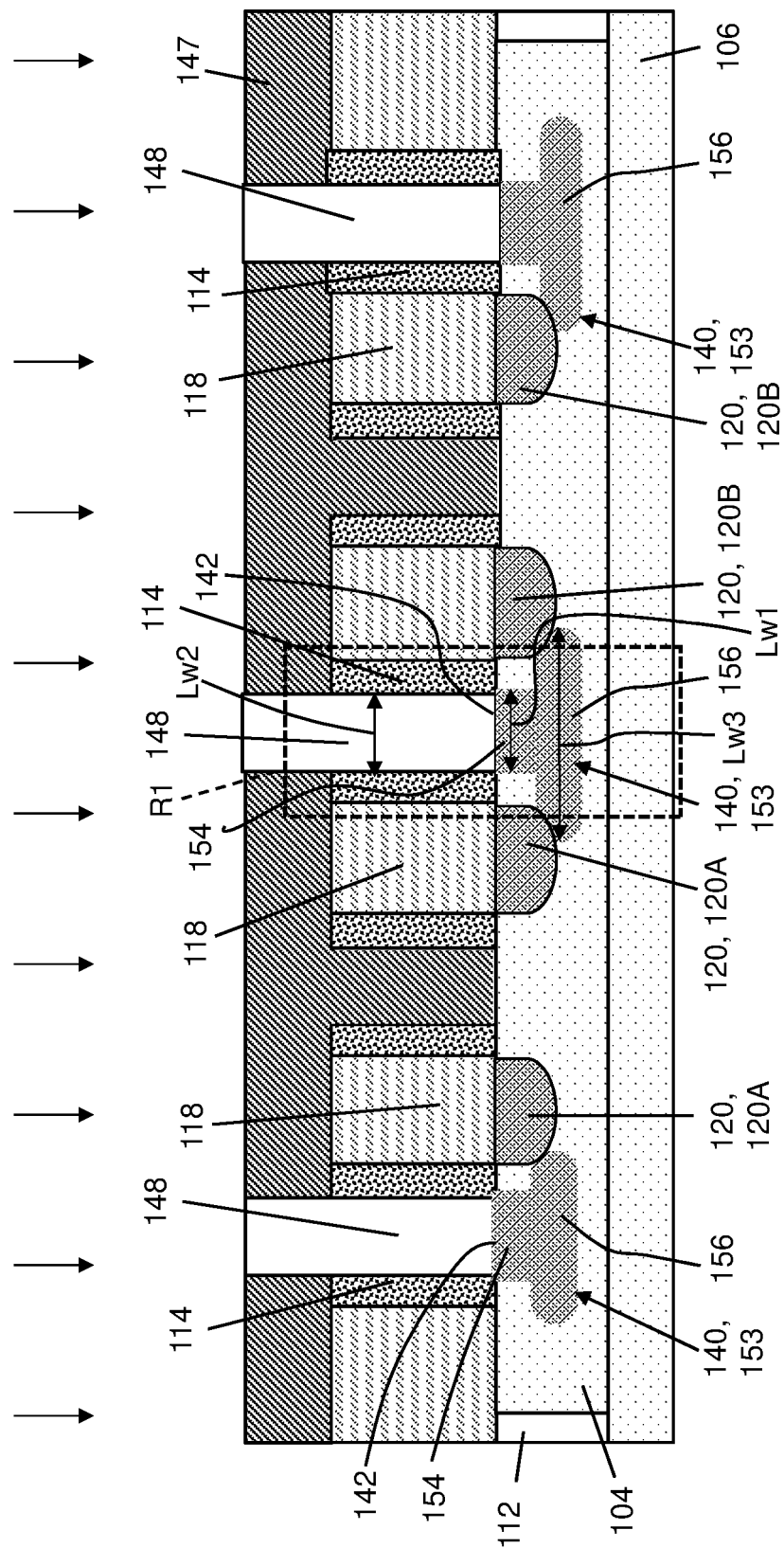
FIG. 4 shows a cross-sectional view of the structure with a mask for forming an electrical isolation structure, according to embodiments of the disclosure.
Figure 5:
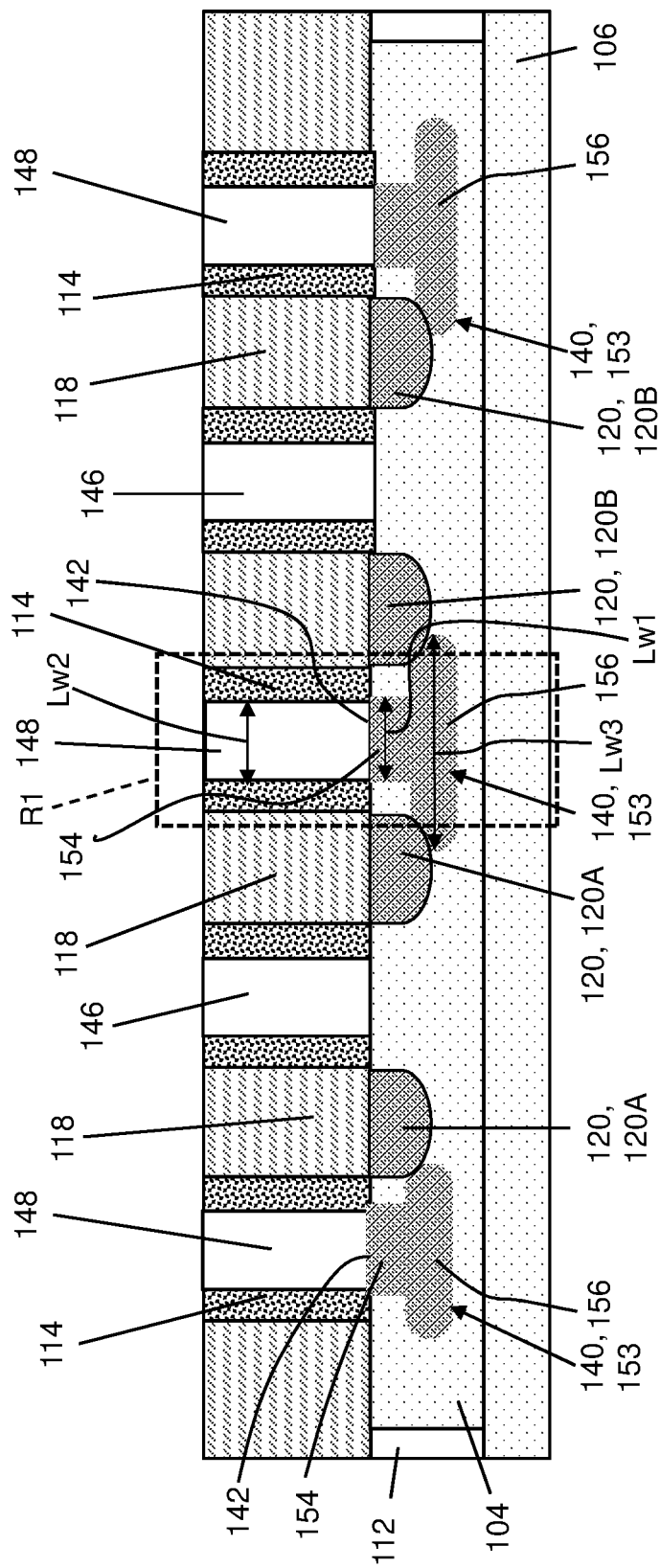
FIG. 5 shows a cross-sectional view of removing the mask of FIG. 4, according to embodiments of the disclosure.
Figure 6:
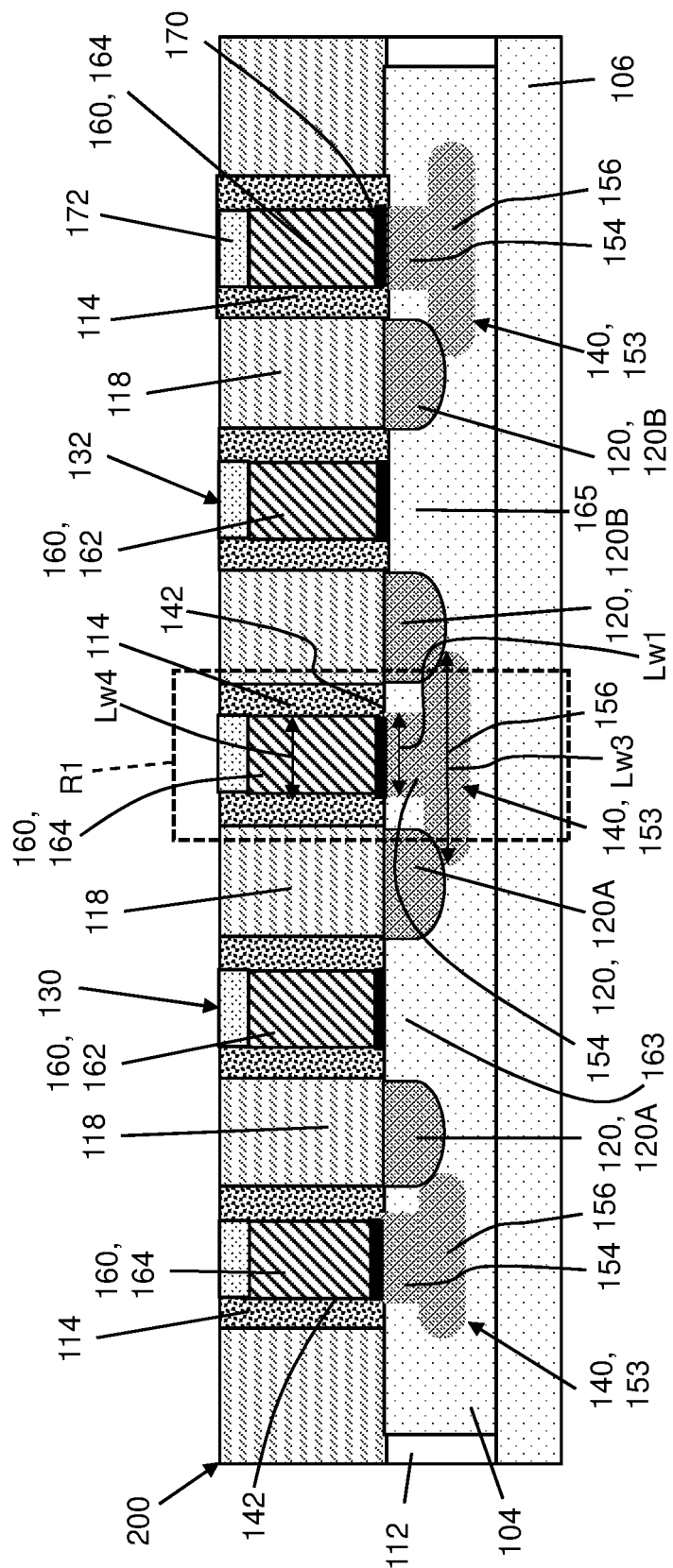
FIG. 6 shows a cross-sectional view of a structure and an electrical isolation structure with metal gates formed, according to embodiments of the disclosure.
Figure 9:
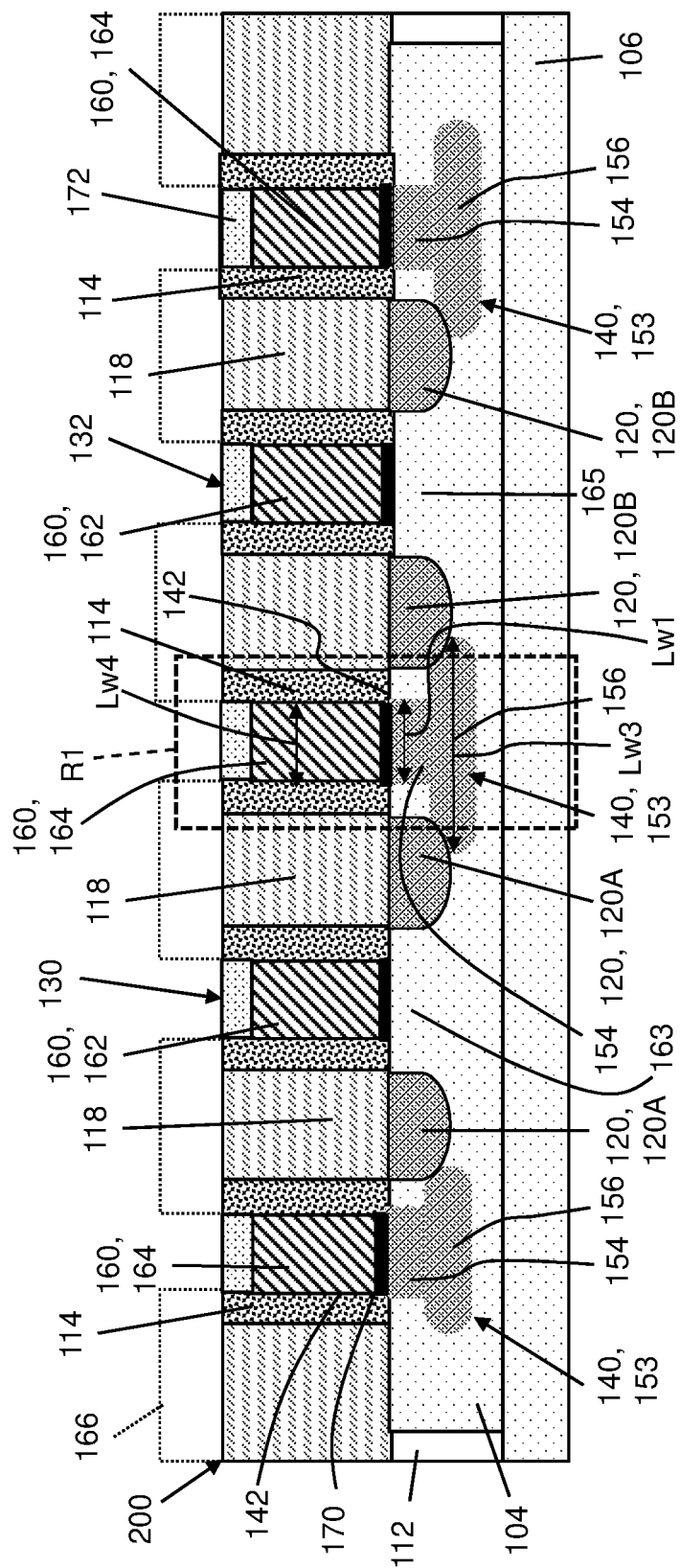
FIG. 9 shows a cross-sectional view of a structure and an electrical isolation structure with metal gates formed, according to embodiments of the disclosure.
Figure 10:
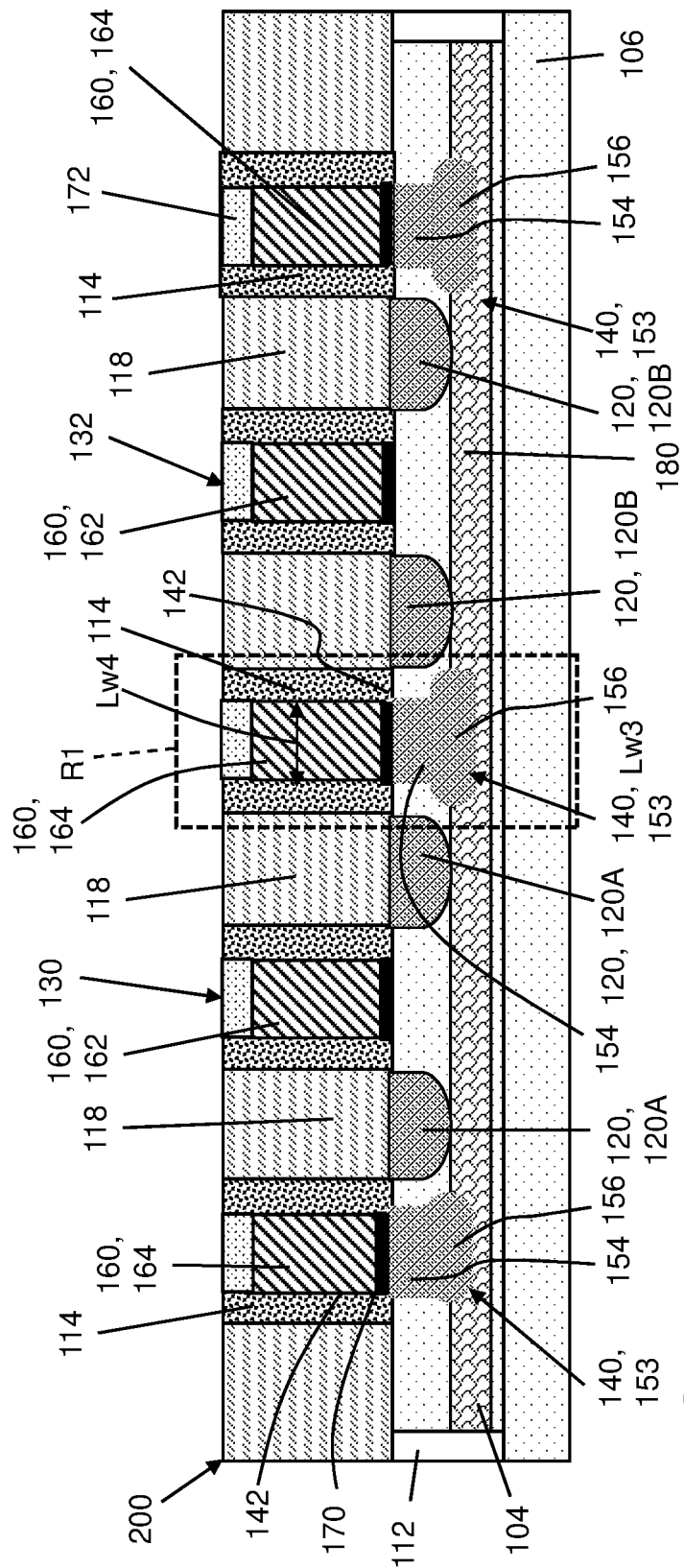
FIG. 10 shows a cross-sectional view of a structure and an electrical isolation structure, according to other embodiments of the disclosure.

FIGS. 3-6 show cross-sectional views of doping semiconductor fin 104 in region R1 between one of first pair source/drain regions 120A and one of second pair of source/drain regions 120B (for finFETs 130, 132 (FIGS. 6, 9, 10)) with a second dopant of an opposing, second polarity, according to one embodiment of the disclosure. That is, where pairs source/drain regions 120A-B include a p-type dopant such as boron, electrical isolation structure 140 (shown in FIGS. 6, 9-11) includes an n-type dopant such as arsenic. In contrast, where pairs source/drain regions 120A-B include an n-type dopant such as arsenic, electrical isolation structure 140 includes a p-type dopant such as boron. In any event, the opposite polarity doping forms an electrical isolation structure 140 in semiconductor fin 104. More particularly, electrical isolation structure 140 forms a PNP or NPN junction with adjacent source/drain regions 120, i.e., one of the source/drain regions for each finFET, that act as an insulator, like a diffusion break, to electrically isolate parts of the fin. In other words, electrical isolation structure 140 creates a depletion layer (i.e., a layer empty of free carriers and having a high electrical resistance) in fin 104 and under an inactive gate 164 (FIGS. 6, 9, 10). As will be described, no channel is formed in region R1 because, while a gate may be formed thereover, it is ultimately an inactive gate, with no electrically operable significance. Electrical isolation structure 140 (FIG. 6, 9-11) extends to an upper surface 142 of semiconductor fin 104. Because material is not removed and filled with a dielectric as typical with diffusion breaks, electrical isolation structure 140 eliminates high levels of structural variability. Furthermore, electrical isolation structure 140 eliminates any break in the semiconductor fin's physical continuity, allowing retention of any stress therein and eliminates any degradation in performance. Any stress imparted to semiconductor fin 104, such as a compressive stress that improves PFET performance, is not lost from pairs of source/drain regions 120A-B. In addition, electrical isolation structure 140 significantly reduces current leakage, which improves overall device performance compared to diffusion breaks.

The doping process according to embodiments of the disclosure may be carried out in any now known or later developed fashion, e.g., ion implantation. Usually in ion implanting, a dopant, a dosage and an energy level are specified and/or a resulting doping level may be specified. A dosage may be specified in the number of atoms per square centimeter (atoms/cm²) and an energy level (specified in keV, kilo-electron-volts), resulting in a doping concentration in the substrate of a number of atoms per cubic centimeter (atoms/cm³). The number of atoms is commonly specified in exponential notation, where a number like "3E15" means 3 times 10 to the 15th power, or a "3" followed by 15 zeroes (3,000,000,000,000,000). An example of doping is implanting with boron (B) with a dosage of between about 1E12 and 1E13 atoms/cm², and an energy of about 40 to 80 keV to produce a doping concentration of between 1E17 and 1E18 atoms/cm³. In certain embodiments, a dopant concentration of electrical isolation structure 140 is less than a dopant concentration of first pair of source/drain regions 120A and second pair of source/drain regions 120B. For example, electrical isolation structure 140 may have a dopant concentration between 1E17 and 1E18 atom/cm³, and the pairs of source/drain regions 120A-B may have a dopant concentration greater than 1E20 atoms/cm³.

Figure 3:
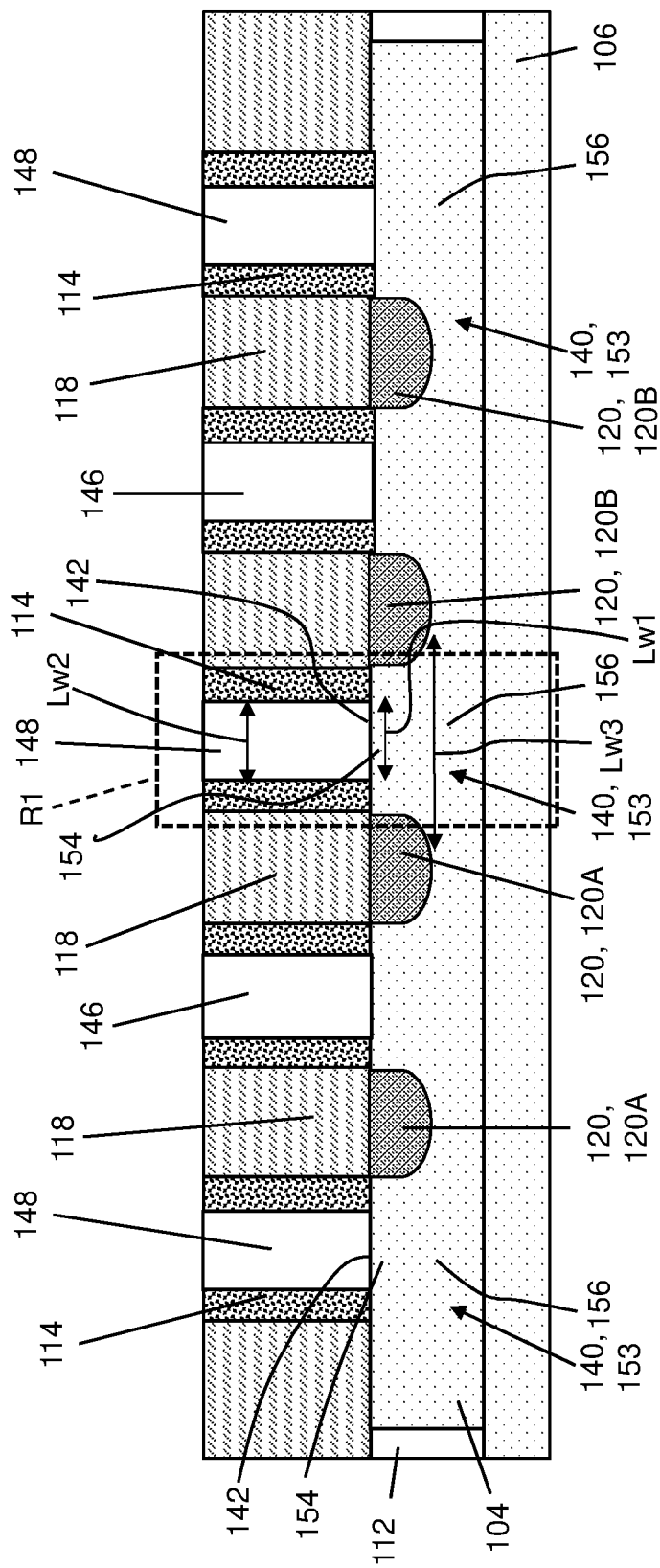
FIG. 3 shows a cross-sectional view of the structure with all dummy gates removed, according to embodiments of the disclosure.

In one embodiment, as shown in FIGS. 3-6, the method may include performing a complete poly pull of all dummy gates 110, as part of an RMG process, prior to doping to form electrical isolation structure 140. In an RMG process, removal of plurality of dummy gates 110 may be referred to as a "poly pull" because the material is removed. It is noted that dummy gates 110 are over fin 104, as shown best in FIG. 1, and are into and out of the page of FIG. 3. The poly pull may include any now known or later developed poly pull process. In one example, a planarization step may be performed to expose the nitride over dummy gates 110, followed by an etch back to remove the nitride over dummy gates 110, and then a planarization to expose dummy gates 110. As shown in FIG. 3, these steps can be followed by any appropriate etching process, e.g., a reactive ion etch (RIE), for dummy gate 110 material to create opening(s) 148 to upper surface 142 of fin(s) 104. FIG. 3 also shows that the poly pull exposes region R1 on fin 104 between one of first pair of source/drain regions 120A for first finFET 130 (FIG. 6) and one of second pair of source/drain regions 120B for second finFET 132 (FIG. 6), i.e., adjacent source/drain regions of each finFET. The poly pull also exposes gate regions 146 for active gates 162 (FIG. 6) of first finFET 130 (FIG. 6) and second finFET 132 (FIG. 6).

FIG. 4 shows forming a mask 147 to expose areas vacated by dummy gates 110C, 110D, 110E (FIG. 2) in which an electrical isolation structure 140, is desired. Mask 147 covers gate regions 146 (FIG. 3) for active gates 162 (FIG. 6) of first finFET 130 (FIG. 6) and second finFET 132 (FIG. 6). Mask 147 would be lithographically patterned to expose regions R1 in which electrical isolation structure 140 is desired, e.g., where dummy gates 110C, 110D, 110E were located. As shown in FIG. 4, the patterned mask 147 may then be used to direct the doping process that forms a body 153 of electrical isolation structure 140. As illustrated in FIG. 4, electrical isolation structure 140 may extend deeper into fin 104 than pairs of source/drain regions 120A-B. Electrical isolation structure 140 may include body 153 including an upper portion 154 and a lower portion 156. It is noted that remaining sidewalls of spacers 114 may direct the doping process, i.e., making upper portion 154 of electrical isolation structure 140 aligned to spacers 114. As shown in FIG. 4, electrical isolation structure 140, i.e., body 153, has upper portion 154 having a lateral width Lw1 that matches a lateral width Lw2 of the at least partially removed dummy gate 110, i.e., Lw1=Lw2. However, body 153 is wider in lower portion 156 than upper portion 154 thereof— compare upper portion 154 lateral width Lw1 with lower portion 156 lateral width Lw3, i.e., Lw3>Lw1. In certain embodiments, lower portion 156 also extends laterally at least partially under source/drain regions 120A-B, i.e., one of first pair of source/drain regions 120A and one of second pair of source/drain regions 120B, which provides additional electrical isolation. FIG. 10 shows options in which body 153 is not under source/drain regions 120.

FIG. 5 shows removing mask 147 (FIG. 4), e.g., using any appropriate ashing process. Removal of mask 147 exposes fin 104 for metal gate formation, i.e., gate regions 146 for active gates 162 (FIG. 6) and openings 148 for inactive gates 164 (FIG. 6).

FIG. 6 shows metal gate formation for active gates 162 for each of first finFET 130 and second finFET 132, i.e., in gate regions 146 (FIGS. 3 and 5) where source/drain regions 120 are both present. That is, FIG. 6 shows forming an active gate 162 for first finFET 130 over a first channel 163 between first pair of source/drain regions 120A and an active gate 162 for second finFET 132 over a second channel 165 between second pair of source/drain regions 120B. This process can be carried out according to any known or later developed RMG processes. Metal gates 160 may include, for example, a gate dielectric 170, and one or more conductive components for providing a gate terminal of a transistor. While individual layers are not shown for clarity, each metal gate 160 may include, for example, a high dielectric constant (high-K) layer, a work function metal layer and a gate conductor. The high-K layer may include any now known or later developed high-K material typically used for metal gates such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). The work function metal layer may include various metals depending on whether for an n-type finFET or a p-type finFET, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The gate conductor may include any now known or later developed gate conductor such as copper (Cu). A gate cap 172 of, for example, a nitride may also be formed over metal gates 160. Metal gate 160 layers can be formed using any appropriate deposition technique, and any necessary planarization of last deposited material.

FIG. 6 also shows forming inactive gates 164 over electrical isolation structures 140. Inactive gates 164 may be substantially identical to active gates 162, and may be formed in a similar manner, as described. Inactive gates 164 may be formed at the same time as active gates 162. No channel is formed under inactive gates 164 because the gates are not electrically operative. The FIGS. 3-6 process may be advantageous because while it is interspersed in the RMG process, it does not otherwise change the conventional RMG process, i.e., using a complete poly pull.

Figure 7:
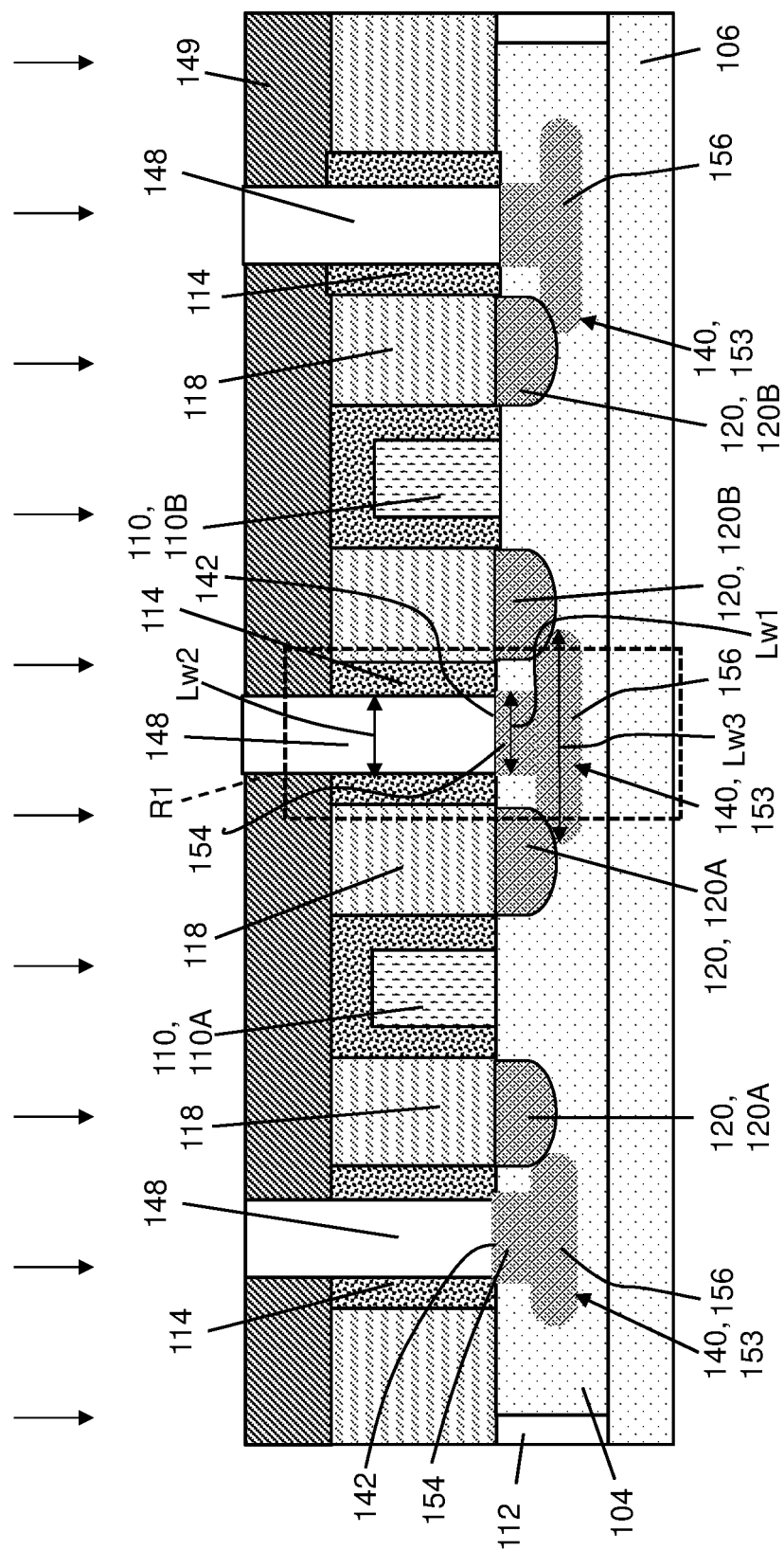
FIG. 7 shows a cross-sectional view of a structure with certain dummy gates removed to form an electrical isolation structure, according to alternative embodiments of the disclosure.
Figure 8:
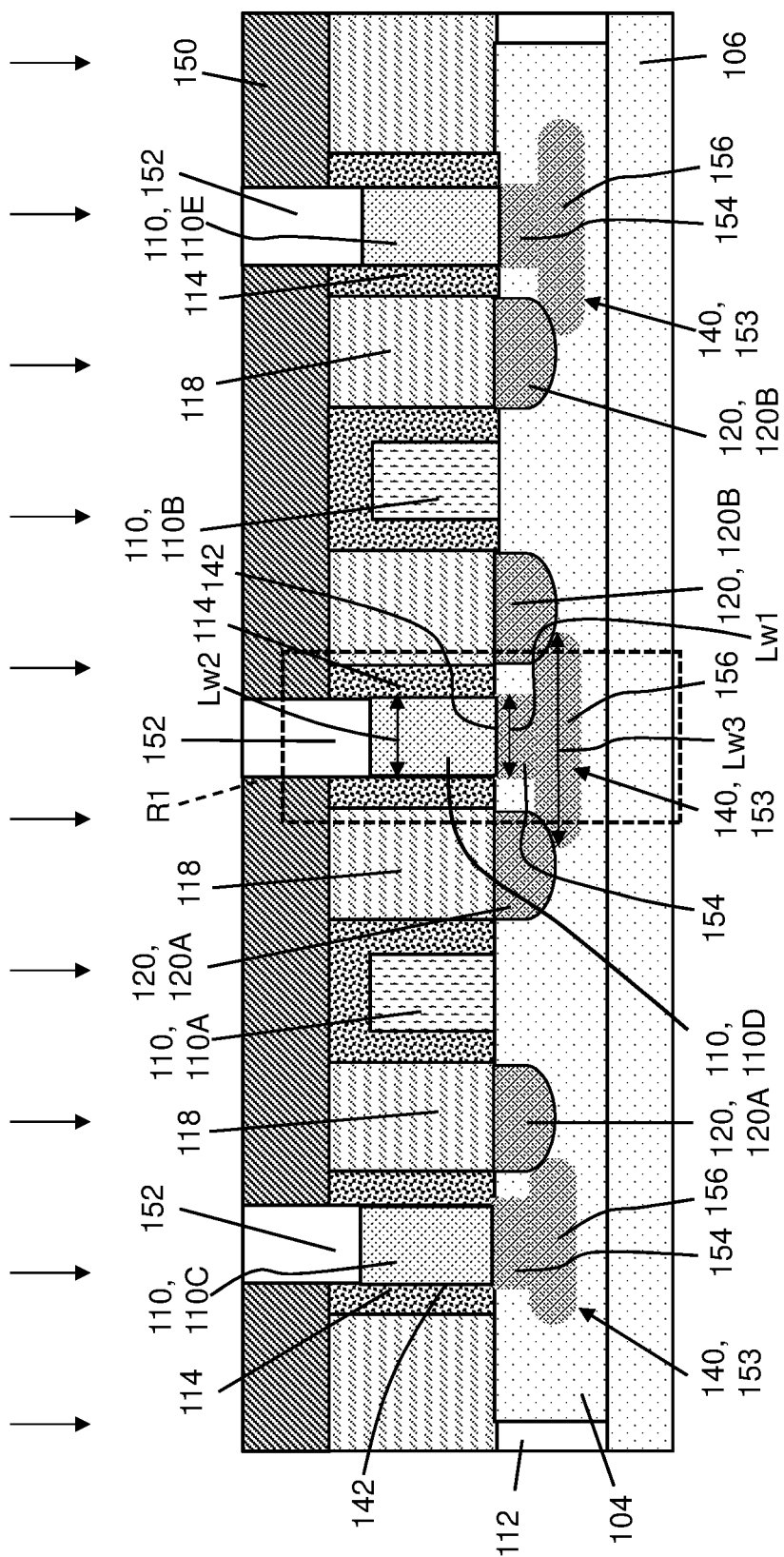
FIG. 8 shows a cross-sectional view of the structure with certain dummy gates partially removed to form an electrical isolation structure, according to alternative embodiments of the disclosure.

FIGS. 7-9 show cross-sectional views of other embodiments of the doping process. In these embodiments, prior to the doping, a portion of dummy gate(s) 110C, 110D, 110E (FIG. 2) is (selectively) removed over region(s) R1 (only 1 labeled for clarity, but three shown) on semiconductor fin 104 between one of first pair of source/drain regions 120A and one of second pair of source/drain regions 120B (only shown for center R1). As noted, pairs source/drain regions 120A-B will eventually be part of first finFET 130 (FIG. 9) and second finFET 132 (FIG. 9). It is noted that the "portion" of dummy gates 110C, 110D, 110E that is removed is that over fin 104, as shown best in FIG. 1, and which is into and out of the page of FIG. 7. As noted, in an RMG process, removal of dummy gates 110 may be referred to as a "poly pull"; accordingly, this step may be referred to as a "partial poly pull" because other dummy gates 110A, 110B are not touched, and a remainder of dummy gates 110C, 110D, 110E outside of region(s) R1 remains in place. This removal process may include, for example, forming a patterning mask 149 to expose dummy gate(s) 110C, 110D, 110E. Mask 149 may include any now known or later developed appropriate masking material, e.g., a nitride hard mask. Any appropriate etching process, e.g., a reactive ion etch (RIE), for spacer 114 and/or dummy gate 110 material can then be performed to create opening(s) 148 to upper surface 142 of fin(s) 104. FIG. 7 also shows the doping process (arrows), creating electrical isolation structure 140. The process can be carried out at any region R1 where a fin break is desired. Electrical isolation structure 140 may have any shape and/or configuration as described relative to FIG. 5.

FIG. 8 shows a cross-sectional view of other embodiments of the doping process. In these embodiments, prior to the doping, a portion of dummy gate(s) 110C, 110D, 110E is selectively exposed over region(s) R1 on semiconductor fin 104 between one of first pair of source/drain regions 120A for first finFET 130 and one of second pair of source/drain regions 120B for second finFET 132 (FIG. 9). As noted, source/drain regions 120A-B will eventually be part of finFETs 130, 132 (FIG. 9). Here, again, the "portion" of dummy gate(s) 110C, 110D, 110E that is exposed is that over fin 104, as shown best in FIG. 1, and which is into and out of the page of FIG. 8. Here, a mask 150 may expose dummy gate(s) 110C, 110D, 110E. Mask 150 may include any now known or later developed appropriate masking material, e.g., a nitride hard mask. Any appropriate etching process(es), e.g., a reactive ion etch (RIE), for spacer 114 material and dummy gate 110C, 110D, 110E material can then be performed to create opening(s) 152 over dummy gate(s) 110C, 110D, 110E. FIG. 8 shows the doping process (arrows) occurring through the (remaining) portion of dummy gate(s) 110C, 110D, 110E, creating electrical isolation structure 140. Here, dummy gate(s) 110C, 110E, 110E are also doped. The process can be carried out at any region R1 where a fin break is desired. Electrical isolation structure 140 may have any shape and/or configuration as described relative to FIG. 5.

FIG. 9 shows a cross-sectional view of a structure 200 after forming metal gates 160. Metal gate formation forms active gates 162 for each of first finFET 130 and second finFET 132, i.e., where source/drain regions 120 are both present, and otherwise forms inactive gates 164 over region(s) R1—where electrical isolation structure 140 is present. No channel is under inactive gates 164. This process can be carried out according to any now known or later developed RMG processes. Here, any remaining dummy gates 110 (FIG. 7-8) or parts thereof are removed (into and out of page). That is, the poly pull process is completed. Here, forming active gate 162 for each of first finFET 130 and second finFET 132 includes removing a remainder of dummy gates 110C, 110D, 110E (FIG. 7-8), and (entirely) removing dummy gates 110A, 110B (FIGS. 7-8). Dummy gate(s) 110 may be removed using any now known or later developed process. In one example, dummy gate(s) 110 (FIGS. 7-8) is etched away, e.g., using a mask 166 (dashed lines). In this case, dummy gate(s) 110 may be removed, for example, by RIE. In addition, this process includes forming active gate 162 for first finFET 130 over first channel 163 between first pair of source/drain regions 120A (where dummy gate 110A (FIGS. 7-8) was removed), and forming active gate 162 for second finFET 132 over second channel 165 between second pair of source/drain regions 102B (where dummy gate 110B (FIGS. 7-8) was removed). Inactive gates 164 are formed where dummy gate(s) 110C, 110D, 110E (FIGS. 2, 8) were previously located—no channel is formed under inactive gates 164. Gates 162, 164 may be formed as previously described.

FIGS. 6 and 9 show cross-sectional views of a structure 200 according to embodiments of the disclosure. Structure 200 may include semiconductor fin 104 on substrate 106. Structure 200 also includes first finFET 130 on substrate 106, and second finFET 132 on substrate 106 adjacent first finFET 130. First finFET 130 includes first pair of source/drain regions 120A separated by channel 163, and second finFET 132 include second pair of source/drain regions 120B separated by second channel 165. First and second pairs of source/drain regions 120A-B each include a first dopant of a first polarity, i.e., an n-type dopant or a p-type dopant. FinFETs 130, 132 thus are of the same polarity. Structure 200 also includes an electrical isolation structure 140 in semiconductor fin 104 between one of first pair of source/drain regions 120A of first finFET 130 and one of second pair of source/drain regions 120B of second FinFET 132. Electrical isolation structure 140 includes a second dopant of an opposing, second polarity. That is, where pairs of source/drain regions 120A-B include a p-type dopant such as boron, electrical isolation structure 140 includes an n-type dopant such as arsenic. In contrast, where pairs of source/drain regions 120A-B include an n-type dopant such as arsenic, electrical isolation structure 140 includes a p-type dopant such as boron. The opposite polarity doping forms an electrical isolation structure 140 in semiconductor fin 104. More particularly, electrical isolation structure 140 forms a PNP or NPN junction with adjacent source/drain regions 120 that act as an insulator, like a diffusion break, to electrically isolate parts of the fin. Electrical isolation structure 140 extends to an upper surface 142 of semiconductor fin 104. Structure 200 also includes inactive gate 164 over electrical isolation structure 140. No channel is formed because inactive gate 164 is not electrically operative. As noted, electrical isolation structure 140 may have upper portion 154 having lateral width Lw1 matching a lateral width Lw4 of a gate stack of inactive gate 164, i.e., Lw1=Lw4. Electrical isolation structure 140 is wider in lower portion 156 than upper portion 154 thereof—compare upper portion 154 lateral width Lw1 with lower portion 156 lateral width Lw3, i.e., Lw3>Lw1. Electrical isolation structure 140 also extends deeper into semiconductor fin 104 than source/drain regions 120A-B. As a result, lower portion 156 may extend laterally at least partially under the one of first pair of source/drain regions 120A and the one of second pair of source/drain regions 120B. FIG. 10 shows an option (left side) in which lower portion 156 does not extend under source/drain regions 120. A dopant concentration of electrical isolation structure 140 may be less than a dopant concentration of first pair of source/drain regions 120A and second pair of source/drain regions 120B. In one example, electrical isolation structure 140 may have a dopant concentration between 1E17 and 1E18 atoms/cm$^3$, and first pair of source/drain regions 120A and second pair of source/drain regions 120B may have a dopant concentration greater than 1E20 atoms/cm$^3$.

Referring to FIG. 10, structure 200 may also optionally include a doped well 180 in semiconductor fin 104, e.g., n-type or p-type, formed early in the processing described herein. In this case, electrical isolation structure 140 may extend into doped well 180.

Referring to FIG. 11, while embodiments of forming electrical isolation structure 140 have been described herein as carried out as part of an RMG process, it is recognized that the doping process that forms body 153 of electrical isolation structure 140 can be performed outside of an RMG process. For example, as shown in FIG. 11, the doping can be performed in fin 104, before gate formation and/or before source/drain region formation, with a mask 182 in place exposing where structure 140 is to be positioned. Mask 182 may advantageously be the same mask typically used to form an opening in fin 104 for a diffusion break. Subsequent conventional processing, e.g., RMG or gate first processing and source/drain region formation, can be performed thereafter to create similar structures to the examples shown in FIGS. 6 and 9. The formation of electrical isolation structure 140 outside of an RMG process is not preferred because, as can be observed in FIG. 11, it lacks the alignment control provided by using dummy gates 110 and spacers 114, and can potentially interfere with other structures.

Embodiments of the disclosure provide electrical isolation structure 140 for adjacent fin transistors (finFETs) 130, 132 including source/drain regions 120A-B that include a first dopant of a first polarity in semiconductor fin 104 on substrate 106. Electrical isolation structure 140 can include body 153 in semiconductor fin 104 between source/drain regions 120A-B. Body 153 includes a second dopant of an opposing, second polarity, as described herein. Body 153 extends to upper surface 142 of semiconductor fin 104. Electrical isolation structure 104 also may include inactive gate 164 over body 153. Upper portion 154 of body 153 may have lateral width Lw1 matching lateral width Lw4 of a gate stack of inactive gate 164. Body 153 may be wider in lower portion 156 than upper portion 154 thereof. Lower portion 156 may extend laterally at least partially under source/drain regions 120A-B. As noted, a dopant concentration of body 153 is less than a dopant concentration of source/drain regions 120A-B.

The electrical isolation structure as described herein provides an effective electrical isolation within a semiconductor fin without the use of dielectrics, such as oxide, between devices. The implementation using doping avoids the structural variability of forming openings in the fin for diffusion breaks, such as sloped surfaces on upper surfaces that lead to current leakage. The structure does not exhibit any performance loss because the fin is continuous. Since fin cut openings do not need to be formed, the implementation has reduced cycle time.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either: (a) an intermediate product, such as a motherboard, or (b) a product. The product can be any product that includes integrated circuit chips, ranging from toys and other low-end applications to advanced computer products having a display, a keyboard or other input device, and a central processor.

The terminology used herein is for describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially" are not to be limited to the precise value specified. In at least some instances, the approximating language may correspond to the precision of an instrument for measuring the value. Here and throughout the specification and claims, range limitations may be combined and/or inter-changed, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described to best explain the principles of the disclosure and the practical application, and to enable others of ordinary skill in the art to understand the disclosure for various embodiments with various modifications as are suited to the particular use contemplated.

What is claimed is:

1. A structure, comprising:
a semiconductor fin on a substrate and including a non-insulating semiconductor material;
a first fin transistor (finFET) on the substrate, the first finFET including a first pair of source/drain regions separated by a first channel;
a second finFET on the substrate adjacent the first finFET, the second finFET including a second pair of source/drain regions separated by a second channel, the first and the second pairs of source/drain regions each including a first dopant of a first polarity; and an electrical isolation structure in the semiconductor fin between one of the first pair of source/drain regions of the first finFET and one of the second pair of source/drain regions of the second finFET, the electrical isolation structure including:
- a lower portion above a bottom surface of the semiconductor fin and extending laterally from one of the first pair of source/drain regions to one of the second pair of source/drain regions, and
- an upper portion over the lower portion, wherein a width of the upper portion is less than a width of the lower portion such that the non-insulating semiconductor material of the semiconductor fin is horizontally between the upper portion and each of the one of the first pair of source/drain regions and the one of the second pair of source/drain regions, wherein an upper surface of the electrical isolation structure is coplanar with an upper surface of the semiconductor fin, and the electrical isolation structure includes a second dopant of an opposing, second polarity.

2. The structure of claim 1, further comprising an inactive gate over the electrical isolation structure.

3. The structure of claim 2, wherein the electrical isolation structure has a lateral width substantially matching a lateral width of a gate stack of the inactive gate.

4. The structure of claim 1, wherein the electrical isolation structure extends deeper into the semiconductor fin than the first and second pairs of source/drain regions.

5. The structure of claim 1, further comprising a doped well in the semiconductor fin, wherein the electrical isolation structure extends into the doped well.

6. The structure of claim 1, wherein a dopant concentration of the electrical isolation structure is less than a dopant concentration of the first pair of source/drain regions and the second pair of source/drain regions.

7. The structure of claim 1, wherein the electrical isolation structure has a dopant concentration between 1E17 and 1E18 atoms per cubic centimeter (atoms/cm$^3$), and the first pair of source/drain regions and the second pair of source/drain regions have a dopant concentration greater than 1E20 atoms/cm$^3$.

8. An electrical isolation structure for adjacent fin transistors (finFETs), the adjacent finFETs including a first pair of source/drain regions separated by a first channel and a second pair of source/drain regions separated by a second channel, the first and second pair of source/drain regions each including a first dopant of a first polarity in a semiconductor fin on a substrate, the electrical isolation structure comprising:
- a body in the semiconductor fin between one of the first pair of source/drain regions and one of the second pair of source/drain regions, the body including:
  - a lower portion above a bottom surface of the semiconductor fin and extending laterally from the one of the first pair of source/drain regions to the one of the second pair of source/drain regions, and
  - an upper portion over the lower portion, wherein a width of the upper portion is less than a width of the lower portion such that a non-insulating semiconductor material of the semiconductor fin is horizontally between the upper portion and each of the one of the first pair of source/drain regions and the one of the second pair of source/drain regions, wherein the body includes a second dopant of an opposing, second polarity and extends to an upper surface of the semiconductor fin.

9. The electrical isolation structure of claim 8, further comprising an inactive gate over the body, wherein the body has a lateral width substantially matching a lateral width of a gate stack of the inactive gate.

10. The electrical isolation structure of claim 8, wherein a dopant concentration of the body is less than a dopant concentration of the first pair of source/drain regions and the second pair of source/drain regions.

11. A method, comprising:
- forming a first pair of source/drain regions for a first fin transistor (finFET) and a second pair of source/drain regions for a second finFET in a semiconductor fin adjacent a region of the semiconductor fin, the first and second pairs of source/drain regions including a first dopant of a first polarity;
- removing a portion of a first dummy gate over a region on the semiconductor fin between one of the first pair of source/drain regions for the first finFET and one of the second pair of source/drain regions for the second finFET;
- doping the semiconductor fin in the region between the one of the first pair of source/drain regions and the one of the second pair of source/drain regions with a second dopant of an opposing, second polarity, forming an electrical isolation structure in the semiconductor fin, wherein the electrical isolation structure extends to an upper surface of the semiconductor fin; and
- forming an active gate for the first finFET over a first channel between the first pair of source/drain regions and an active gate for the second finFET over a second channel between the second pair of source/drain regions.

12. The method of claim 11, wherein the forming the active gate for each of the first finFET and the second finFET includes removing a remainder of the first dummy gate, removing a second dummy gate and removing a third dummy gate, and forming the active gate for the first finFET where the second dummy gate was removed and forming the active gate for the second finFET where the third dummy gate was removed.

13. The method of claim 11, further comprising:
- prior to the doping, removing a plurality of dummy gates to expose the region on the semiconductor fin between the one of the first pair of source/drain regions for the first finFET and the one of the second pair of source/drain regions for the second finFET, and gate regions for the first finFET and the second finFET, and
- prior to the doping, masking the gate regions for the first finFET and the second finFET.

14. The method of claim 11, wherein the doping occurs through the removed portion of the first dummy gate.

15. The method of claim 11, wherein a dopant concentration of the region is less than a dopant concentration of the first and second pairs of source/drain regions.

* * * * *